US012641704B2

(12) United States Patent (10) Patent No.: US 12,641,704 B2
Tan et al. (45) Date of Patent: May 26, 2026

(54) METHOD FOR GENERATING EXTREME ULTRAVIOLET LIGHT, EXTREME ULTRAVIOLET LIGHT SOURCE ASSEMBLY AND OPTICAL SYSTEM

(71) Applicant: Shaanxi Startorus Fusion Technology Company Limited, Xi'an (CN)

(72) Inventors: Yi Tan, Xi'an (CN); Rui Chen, Xi'an (CN)

(73) Assignee: Shanghai Startorus Fusion Technology Company Limited, Shanghai (CN)

( * ) Notice: Subject to any disclaimer, the term of this patent is extended or adjusted under 35 U.S.C. 154(b) by 308 days.

(21) Appl. No.: 18/291,818

(22) PCT Filed: Nov. 20, 2023

(86) PCT No.: PCT/CN2023/132635
§ 371 (c)(1),
(2) Date: Jan. 24, 2024

(87) PCT Pub. No.: WO2025/060227
PCT Pub. Date: Mar. 27, 2025

(65) Prior Publication Data
US 2025/0098057 A1 Mar. 20, 2025

(30) Foreign Application Priority Data
Sep. 19, 2023 (CN) .......................... 202311212358.6

(51) Int. Cl.
*G03F 7/00* (2006.01)
*H05H 1/10* (2006.01)
*H05H 1/46* (2006.01)

(52) U.S. Cl.
CPC .......... *H05H 1/10* (2013.01); *G03F 7/70033* (2013.01); *H05H 1/4645* (2021.05)

(58) Field of Classification Search
CPC ..... G03F 7/70033; H05H 1/10; H05H 1/4645
See application file for complete search history.

(56) References Cited

U.S. PATENT DOCUMENTS

| | | | |
|---|---|---|---|
| 2004/0135517 A1 | 7/2004 | Schriever et al. | |
| 2010/0181503 A1* | 7/2010 | Yanagida | G03F 7/70033 |
| | | | 250/504 R |
| 2010/0193711 A1* | 8/2010 | Watanabe | G03F 7/70033 |
| | | | 250/504 R |

FOREIGN PATENT DOCUMENTS

| | | |
|---|---|---|
| CN | 106064167 | 11/2016 |
| CN | 109302791 | 2/2019 |
| CN | 111399346 | 7/2020 |

(Continued)

*Primary Examiner* — Mark R Gaworecki
(74) *Attorney, Agent, or Firm* — Woods Oviatt Gilman LLP; Katherine H. McGuire, Esq.

(57) ABSTRACT

A method for generating an extreme ultraviolet light, an extreme ultraviolet light source assembly, and an optical system are provided. With the method for generating an extreme ultraviolet light, a plasma is generated by a magnetic confinement device, if the plasma meets a preset injection condition, a heavy metal injection device is controlled to inject a designated heavy metal into the magnetic confinement device, so that the designated heavy metal interacts with the plasma in the magnetic confinement device to generate an extreme ultraviolet light, and an optical device is controlled to collect the extreme ultraviolet light.

15 Claims, 3 Drawing Sheets

(56)     References Cited

FOREIGN PATENT DOCUMENTS

| JP | 2011222302 | 11/2011 | |
| KR | 20220132933 | 10/2022 | |
| WO | WO-03087867 A2 * | 10/2003 | ............. H05G 2/007 |
| WO | WO-2006064592 A1 * | 6/2006 | ........... H05G 2/0027 |

* cited by examiner

METHOD FOR GENERATING EXTREME ULTRAVIOLET LIGHT, EXTREME ULTRAVIOLET LIGHT SOURCE ASSEMBLY AND OPTICAL SYSTEM

The present disclosure is the national phase of International Patent Application No. PCT/CN2023/132635, titled "METHOD FOR GENERATING EXTREME ULTRAVIOLET LIGHT, EXTREME ULTRAVIOLET LIGHT SOURCE ASSEMBLY AND OPTICAL SYSTEM", filed on Nov. 20, 2023, which claims priority to Chinese Patent Application No. 202311212358.6, titled "METHOD FOR GENERATING EXTREME ULTRAVIOLET LIGHT, EXTREME ULTRAVIOLET LIGHT SOURCE ASSEMBLY AND OPTICAL SYSTEM", filed on Sep. 19, 2023 with the National Intellectual Property Administration, PRC, both of which are incorporated herein by reference in their entireties.

FIELD

The present disclosure relates to the technical field of semiconductors, and in particular to a method for generating an extreme ultraviolet light, an extreme ultraviolet light source assembly and an optical system.

BACKGROUND

With the continuous improvement of integration of chips, a feature size for photolithography is required to be continuously reduced. The extreme ultraviolet (EUV) light source is newly developed. A wavelength of an exposure light generated by the EUV light source is 13.5 nanometers or smaller. When applying the EUV light source to an exposure system, a small feature size can be obtained for photolithography.

At present, laser produced plasma (LPP) is a mainstream way to generate an extreme ultraviolet light. The principle of this way is that a laser source generates a laser beam to bombard a tin (Sn) target material, to excite a plasma, which radiates an extreme ultraviolet light outward. However, the laser produced plasma has many problems such as a high cost, a short lifetime, and a poor stability. Therefore, there is an urgent need for a low cost and stable solution for generating an extreme ultraviolet light.

SUMMARY

In view of this, a method for generating an extreme ultraviolet light is provided according to an embodiment of the present disclosure. One or more embodiments of the present disclosure also involve an extreme ultraviolet light source assembly and an optical system to address the technical deficiency in conventional art.

According to a first aspect of the embodiments of the present disclosure, a method for generating an extreme ultraviolet light is provided, which includes:

generating a plasma by a magnetic confinement device;

controlling, if the plasma meets a preset injection condition, a heavy metal injection device to inject a designated heavy metal into the magnetic confinement device, where the designated heavy metal interacts with the plasma in the magnetic confinement device to generate an extreme ultraviolet light; and controlling an optical device to collect the extreme ultraviolet light.

According to a second aspect of the embodiments of the present disclosure, an extreme ultraviolet light source assembly is provided, which includes a magnetic confinement device, a heavy metal injection device, and an optical device. The heavy metal injection device is connected to the magnetic confinement device. The magnetic confinement device is configured to generate a plasma. The heavy metal injection device is configured to inject a designated heavy metal into the magnetic confinement device if the plasma meets a preset injection condition, where the designated heavy metal interacts with the plasma in the magnetic confinement device to generate an extreme ultraviolet light. The optical device is configured to collect the extreme ultraviolet light.

In a third aspect of the embodiments of the present disclosure, an optical system is provided, which includes the extreme ultraviolet light source assembly as described in the second aspect.

With the method for generating an extreme ultraviolet light according to the embodiment of the present disclosure, a plasma is generated by a magnetic confinement device; if the plasma meets a preset injection condition, the heavy metal injection device is controlled to inject a designated heavy metal into the magnetic confinement device, so that the designated heavy metal interacts with the plasma in the magnetic confinement device to generate an extreme ultraviolet light; the optical device is controlled to collect the extreme ultraviolet light. The magnetic confinement device that meets the requirement of generating an extreme ultraviolet light has a low cost, simple and stable operation, and a high electro-optic conversion efficiency, thereby improving the stability of the extreme ultraviolet light, and reducing the cost of generating an extreme ultraviolet light.

Figure 1:
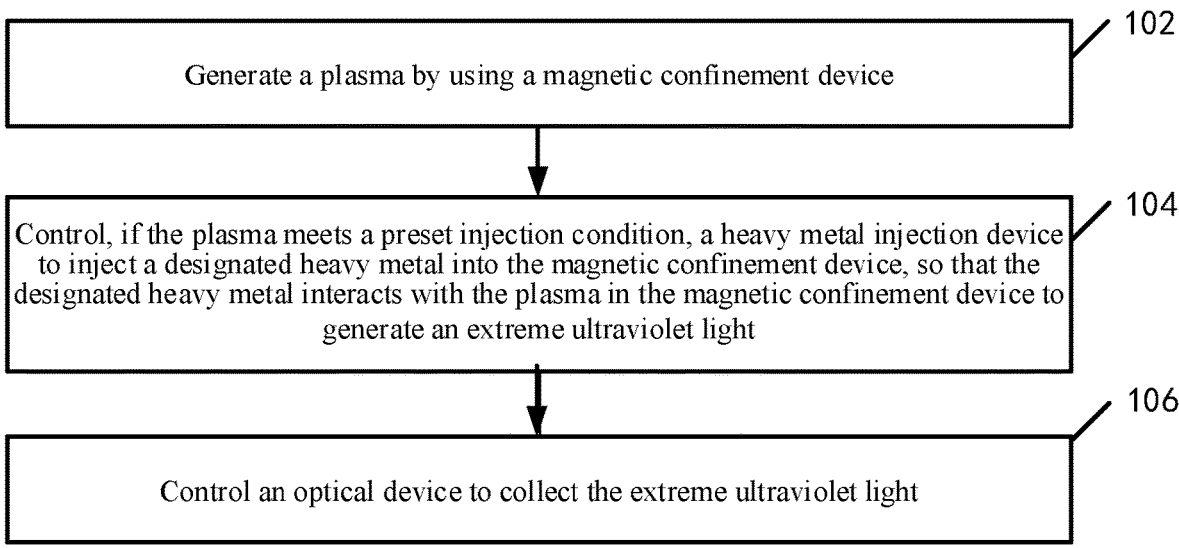
FIG. 1 is flowchart of a method for generating an extreme ultraviolet light according to an embodiment of the present disclosure.

Reference signs are listed as follows.

100—Magnetic confinement device, 200—Heavy metal injection device, 300—Optical device, 400—Detecting device, 500—Control device, 600—Data collection device;

1002—Vacuum chamber, 1004—Magnet, 1006—Magnet power supply, 1008—Radio frequency power source, 1010—Radio frequency wave antenna, 1012—Pumping set, 1014—Intake valve assembly.

DETAILED DESCRIPTION OF EMBODIMENTS

Many details are described in the following description to facilitate a thorough understanding of the present disclosure. However, the present disclosure may be implemented in many other ways different from the ways described herein, and those skilled in the art may make similar promotions without departing from the content of the present disclosure. Therefore, the present disclosure is not limited by the specific embodiments disclosed below.

The terms used in one or more embodiments of the present disclosure are only used for the purpose of describing specific embodiments and are not intended to limit the one or more embodiments of the present disclosure. The singular forms of "one", "said", and "the" used in one or more embodiments of the present disclosure and the claims are also intended to include the plural forms, unless clearly indicated in the context. It is also to be understood that the terms "and/or" used in one or more embodiments of the present disclosure refer to and include any or all possible combinations of one or more associated listed items.

It is to be understood that although various kinds of information may be described by using terms such as "first", "second" in one or more embodiments of the present disclosure, such information should not be limited to these terms. These terms are only used to distinguish information of the same type from each other. For example, without departing from the scope of one or more embodiments of the present disclosure, "the first" may also be referred to as "the second", and similarly, "the second" may also be referred to as "the first". Depending on the context, the wording "if" used herein may be interpreted as "when" or "in a case that" or "in response to".

Firstly, the terms involved in one or more embodiments of the present disclosure are described below.

Photolithography is an important step in the manufacturing process of a semiconductor device, which may be used to form a lithographic pattern in a photoresist layer through an exposure process and a development process. However, with the continuous improvement of integration of chips, the feature size for photolithography needs to be continuously reduced. According to the diffraction limitation theory of light, the minimum feature size that may be resolved based on a light wave is proportional to a wavelength of the light wave, thus a short wavelength light is conducive to obtain a high-precise photolithography imaging.

Tokamak, when powered on, may generate a high helical magnetic field inside itself, to heat the plasma therein to a very high temperature, to achieve the purpose of nuclear fusion.

Magnetic mirror refers to a magnetic field configuration formed by two coils with the same current direction arranged in a way that their axes coincide. The magnetic field is highest at the center of each coil and weakest in the middle part of the coils.

Stellarator refers to a magnetic confinement fusion experimental device with an external spiral winding. The stellarator includes a closed tube and an external coil, the closed tube is a straight line, a "runway" shape, or a spatial curve shape. A common stellarator has two or three pairs of spiral windings, where the stellarator having two pairs of spiral windings has a magnetic surface shape similar to an ellipse, and the stellarator having three pairs of spiral windings has a magnetic surface shape similar to a triangle. Adjacent spiral windings are provided with currents of equal magnitude and opposite directions. In a case that the magnetic field generated by the spiral windings is combined with a longitudinal magnetic field, the magnetic line has a rotational transformation, which can constrain the plasma without a longitudinal current.

Field Reversed Configuration (FRC) is a linear device, when a magnetic mirror magnetic field generated by a reversed current of the plasma inside the FRC is greater than a magnetic mirror magnetic field generated by a current of an external coil, the internal magnetic field will reverse in some areas, forming a closed magnetic field structure.

Reversed field pinch is a type of annular magnetic confinement fusion device, the main feature of the reversed field pinch is that the magnetic field that constrains the plasma is generated by an internal current of the plasma, which has advantages such as meeting a fusion ignition condition by purely ohmic heating and a high-quality power density.

Plasma is a form of material primarily composed of free electrons and charged ions. Generally, the plasma is usually formed under conditions of a high temperature, a high energy, or a strong electric field. One common way is to heat a gas, so that the atoms or molecules in the gas can obtain sufficient energy and became ionized, to form the plasma.

With the development of the semiconductor manufacturing technology and the nuclear fusion technology, a small feature size can be obtained for photolithography when applying the extreme ultraviolet light source to an exposure system, thus the generation of an extreme ultraviolet light has gradually become a research focus.

At present, an extreme ultraviolet light is usually generated based on laser produced plasma. However, the technology of laser produced plasma still has many problems such as a high cost, a short lifetime, and a poor stability. The cost of an extreme ultraviolet light source by the technology of laser produced plasma is generally relative high. In a case that the tin target used in the technology of laser produced plasma is subjected to high-energy radiation of a laser beam, a hot plasma may be formed, which can generate high-energy ions and atoms. These ions and atoms will have a strong impact and corrosion on the tin target, leading to severe loss and burning damage to the tin target. In addition, due to the corrosion and burning damage of the tin target, a large amount of debris and smoke will be caused, which may adhere to a surface of an optical element, affecting the radiation efficiency and stability of the extreme ultraviolet light source.

To address the above problem, a method for generating an extreme ultraviolet light is provided according to an embodiment of the present disclosure, which includes: generating a plasma by a magnetic confinement device; controlling, if the plasma meets a preset injection condition, the heavy metal injection device to inject a designated heavy metal into the magnetic confinement device, so that the designated heavy metal interacts with the plasma in the magnetic confinement device to generate an extreme ultraviolet light; and controlling the optical device to collect the extreme ultraviolet light.

It is to be noted that the magnetic confinement device provided in the embodiment of the present disclosure has the advantages of a low cost, simple and stable operation, and a high electro-optic conversion efficiency. Specifically, taking a tokamak as an example of the magnetic confinement device, in the process of generating an extreme ultraviolet light in the present disclosure, the plasma in the tokamak does not need to reach a fusion nuclear reaction temperature. Therefore, the cost and requirement of the tokamak for generating an extreme ultraviolet light are greatly reduced, and the difficulty of generating the extreme ultraviolet light is also greatly reduced. Moreover, as the plasma generated by the extreme ultraviolet light source assembly can be constrained in the vacuum chamber of the tokamak through the magnetic field, the corrosion and burning damage to the wall material of the emitting light source by the plasma are effectively reduced, thereby prolonging the lifetime of the extreme ultraviolet light source assembly.

In the present disclosure, a method for generating an extreme ultraviolet light is provided, the present disclosure also relates to an extreme ultraviolet light source assembly and an optical system, which are described in detail in the following embodiments.

Reference is made to FIG. 1, which is a flowchart of a method for generating an extreme ultraviolet light according to an embodiment of the present disclosure. The method includes the following steps 102, 104 and 106.

In step 102, a plasma is generated by a magnetic confinement device.

Specifically, magnetic confinement refers to constraining the motion of a charged particle in a plasma by a magnetic field. The magnetic confinement device includes, but is not limited to, any one of a tokamak, a stellarator, a magnetic mirror, a field reversed configuration, or a reversed field pinch. The tokamak may be circular or spherical. The tokamak includes a vacuum chamber, a magnet, a magnet power supply, a radio frequency power source, a radio frequency wave antenna, a pumping set, and an intake valve assembly.

It is to be noted that before the plasma is generated by the magnetic confinement device, the extreme ultraviolet light source assembly may be maintained and repaired to ensure that the extreme ultraviolet light source assembly is in a good condition and can function properly.

In practice, taking the tokamak as an example of the magnetic confinement device, the process of generating a plasma by the tokamak may include the following steps: first, a pumping set may be controlled to discharge gases in the vacuum chamber, ensuring that the vacuum chamber reaches the required high vacuum environment, generally, in an order of 10-5 Pa; secondly, the magnet power supply may be turned on to activate a superconducting coil, to generate a circumferential magnetic field of 1 T to 2 T at a magnetic axis of the tokamak; next, a millisecond pulse intake valve assembly may be activated to inject an appropriate amount of high-purity hydrogen into the vacuum chamber, with an injection pressure generally ranging from 10-2 Pa to 10-3 Pa; finally, the radio frequency power source may be turned on to couple a high-power microwave or millimeter wave into the plasma through a radio frequency wave antenna. As the hydrogen is pre ionized by hot electrons, the injected 2.45 GHz high-power microwave or millimeter wave can effectively excite and maintain a circular plasma current until the plasma meets the preset injection condition, where the plasma current is generally 100 kA.

In step 104, if the plasma meets the preset injection condition, the heavy metal injection device is controlled to inject a designated heavy metal into the magnetic confinement device, so that the designated heavy metal interacts with the plasma in the magnetic confinement device to generate an extreme ultraviolet light.

In one or more embodiments of the present disclosure, after the plasma is generated by the magnetic confinement device, the heavy metal injection device may be controlled to inject a designated heavy metal into the magnetic confinement device if the plasma meets the preset injection condition, so that the designated heavy metal interacts with the plasma in the magnetic confinement device to generate an extreme ultraviolet light.

Specifically, the preset injection condition may be that the plasma reaches a certain temperature and density, such as a density of $10^{18}$ m$^{-3}$, an electron temperature of 10 million degrees, and a plasma current of 100 kA. In an embodiment, the plasma meeting the preset injection condition is called a steady-state plasma, which refers to a plasma during steady-state operation. The heavy metal refers to a metal with a density greater than 4.5 g/cm$^3$. The designated heavy metal refers to a metal element that can produce a strong extreme ultraviolet light. The designated heavy metal includes at least one of a tin powder, a tungsten powder, a nickel powder, and a tantalum powder.

Further, after the plasma is generated by the magnetic confinement device, the heavy metal injection device may be controlled to inject the designated heavy metal into the magnetic confinement device, and an injection rate and an injection angle of the designated heavy metal may be adjusted appropriately to ensure that the designated heavy metal of a target mass is excited to produce the extreme ultraviolet light. Taking the tin powder as an example of the designated heavy metal, if the electron density is $10^{18}$ m$^{-3}$, the tin atom density is $10^{15}$ m$^{-3}$, and the electron temperature is 10 million degrees, an impurity radiation power of tin may be estimated, according to the following formula (1), to be in the order of 100 W, which is sufficient to generate the extreme ultraviolet light and may be further increased by increasing the density.

$$P_R = n_e n_I R \qquad (1)$$

where $P_R$ represents a radiation power, ne represents an electron density, $n_I$ represents a tin atom density, and R represents an electron temperature.

In practice, in the process of the heavy metal injection device injecting the designated heavy metal into the magnetic confinement device, any one of a tin powder, a tungsten powder, a nickel powder, and a tantalum powder may be selected as the designated heavy metal. There are various ways for the heavy metal injection device to inject the designated heavy metal into the magnetic confinement device, which may be selected according to actual needs and is not limited in the embodiment of the present disclosure.

In a possible implementation of the present disclosure, the heavy metal injection device may intermittently inject the designated heavy metal into the magnetic confinement device.

In another possible implementation of the present disclosure, in order to ensure the stability of the extreme ultraviolet light source, the heavy metal injection device may continuously inject the designated heavy metal into the magnetic confinement device, that is, the controlling the heavy metal injection device to inject the designated heavy metal into the magnetic confinement device may include the following step:

controlling the heavy metal injection device to continuously inject the designated heavy metal of a target mass into the magnetic confinement device.

Specifically, the target mass refers to a mass of the designated heavy metal injected into the magnetic confinement device, which includes, but is not limited to, a weight and a volume.

In practice, the heavy metal injection device may inject the designated heavy metal into the magnetic confinement device at designated rate and angle. The designated heavy metal is heated in the magnetic confinement device to release heavy metal atoms, which interact with other atoms in the plasma and is excited to generate the extreme ultraviolet light.

With the solution of the embodiment of the present disclosure, the heavy metal injection device may continuously inject the designated heavy metal of a target mass into the magnetic confinement device, avoiding the problem of a high cost of the extreme ultraviolet light source due to waste of the designated heavy metal, and also avoiding instability of the extreme ultraviolet light source due to insufficient designated heavy metal. Furthermore, continuous injection of the designated heavy metal further ensures the stability of the extreme ultraviolet light source.

In an embodiment, before the controlling the heavy metal injection device to continuously inject the designated heavy metal of a target mass into the magnetic confinement device, the target mass of the designated heavy metal may be determined. There are various ways to determine the target mass, which may be selected according to actual needs and is not limited in the embodiment of the present disclosure.

In a possible implementation of the present disclosure, the target mass may be randomly generated.

In another possible implementation of the present disclosure, generally, the designated heavy metal cannot be completely ionized in the magnetic confinement device. Therefore, the target mass may be determined based on an ionization rate of the designated heavy metal injected into the magnetic confinement device. That is, before the controlling the heavy metal injection device to continuously inject the designated heavy metal of a target mass into the magnetic confinement device, the method may further include the following step:

determining the target mass of the designated heavy metal based on an optical power of the extreme ultraviolet light and an ionization rate of the designated heavy metal.

Specifically, the optical power refers to a work of the extreme ultraviolet light per unit time. As ionization rates of different designated heavy metals may be different from each other, target masses of heavy metals injected into the magnetic confinement device are usually different from each other.

With the solution of the embodiment of the present disclosure, the target mass is determined based on the light power of the extreme ultraviolet light and the ionization rate of the designated heavy metal, ensuring the accuracy of the target mass.

In step 106, the optical device is controlled to collect the extreme ultraviolet light.

In one or more embodiments of the present disclosure, a plasma is generated by a magnetic confinement device; if the plasma meets a preset injection condition, the heavy metal injection device is controlled to inject a designated heavy metal into the magnetic confinement device, so that the designated heavy metal interacts with the plasma in the magnetic confinement device to generate an extreme ultraviolet light, and the optical device may be controlled to collect the extreme ultraviolet light.

Specifically, the extreme ultraviolet light may be referred to as extreme ultraviolet light radiation. The optical device includes, but is not limited to, a mirror, a filter, a focusing mirror, and a spectrometer.

With the solution of the embodiment of the present disclosure, the magnetic confinement device that meets the requirement of generating an extreme ultraviolet light has a low cost, a simple and stable operation, and a high electro-optic conversion efficiency, improving the stability of the extreme ultraviolet light and reducing the cost of generating the extreme ultraviolet light.

In an embodiment, after the optical device is controlled to collect the extreme ultraviolet light, the optical device may be controlled to filter and focus the extreme ultraviolet light, and accurately measure and control the extreme ultraviolet light, thereby ensuring the stability of the extreme ultraviolet light and the purity of the extreme ultraviolet spectrum.

In an embodiment, before the controlling the heavy metal injection device to inject a designated heavy metal into the magnetic confinement device, the method may further include the following steps:

detecting the plasma to obtain a plasma parameter; and determining whether the plasma meets the preset injection condition based on the plasma parameter.

Specifically, the plasma parameter includes, but is not limited to, a density, a temperature, a shape, an impurity, and a magnetic field.

It is to be noted that when determining whether the plasma meets the preset injection condition based on the plasma parameter, a reference parameter corresponding to a plasma that meets the preset injection condition may be obtained. The detected plasma parameter may be compared with the reference parameter, if the plasma parameter does not reach the reference parameter, it indicates that the plasma does not meet the preset injection condition; and if the plasma parameter reach the reference parameter, it indicates that the plasma meets the preset injection condition. The reference parameter is generally a density of $10^{18}$ $m^{-3}$, an electron temperature of 10 million degrees, and a plasma current of 100 kA.

With the solution of the embodiment of the present disclosure, the plasma is detected and a plasma parameter is obtained; it is determined whether the plasma meets the preset injection condition based on the plasma parameter. The heavy metal injection device is controlled to inject the designated heavy metal into the magnetic confinement device only if the plasma meets the preset injection condition, this ensures that the plasma meets the preset injection condition when the designated heavy metal is injected into the magnetic confinement device, further ensuring the stability of generating the extreme ultraviolet light.

In an embodiment, after the determining whether the plasma meets the preset injection condition based on the plasma parameter, the method may further include the following step:

adjusting the plasma parameter if the plasma does not meet the preset injection condition.

It is to be noted that in a case that the plasma does not meet the preset injection condition, the heavy metal injection device will not inject the designated heavy metal into the magnetic confinement device. In the embodiment of the present disclosure, in order to generate an extreme ultraviolet light, the plasma parameter may be adjusted until the plasma meets the preset injection condition, and thus the heavy metal injection device is controlled to inject the designated heavy metal into the magnetic confinement device.

With the solution of the embodiment of the present disclosure, the plasma parameter is adjusted if the plasma does not meet the preset injection condition, so that a density, a temperature, a shape, and other parameters of the plasma can be controlled accurately, thereby generating more stable extreme ultraviolet light.

In an embodiment, after the controlling the optical device to collect the extreme ultraviolet light, the method may further include the following step:

collecting and recording the plasma parameter and an extreme ultraviolet light parameter.

It is to be noted that after collecting and recording the plasma parameter and an extreme ultraviolet light parameter, it may be determined whether the extreme ultraviolet light generated by the extreme ultraviolet light source assembly meets actual requirements based on the plasma parameter and the extreme ultraviolet light parameter. If the extreme ultraviolet light does not meet the actual requirements, it is required to return to regenerate the extreme ultraviolet light.

With the solution of the embodiment of the present disclosure, the plasma parameter and the extreme ultraviolet light parameter are collected and recorded, ensuring that the operation process of the extreme ultraviolet light source assembly is traceable.

Figure 2:
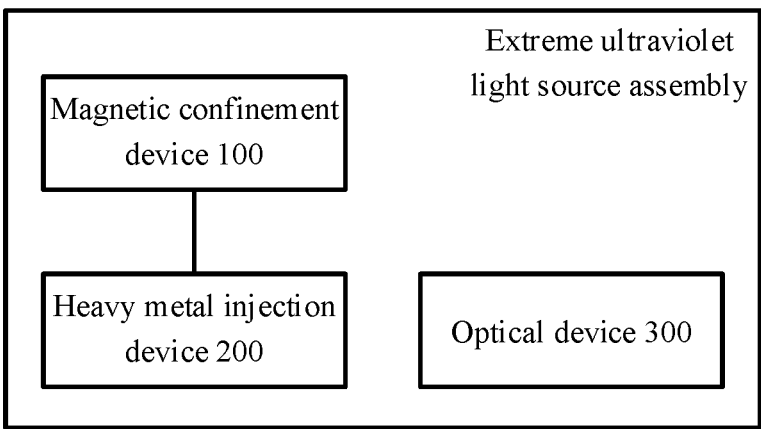
FIG. 2 is a diagram of an architecture of an extreme ultraviolet light source assembly according to an embodiment of the present disclosure.

Reference is made to FIG. 2, which is a diagram of an architecture of an extreme ultraviolet light source assembly according to an embodiment of the present disclosure. As shown in FIG. 2, the extreme ultraviolet light source assembly includes a magnetic confinement device 100, a heavy metal injection device 200, and an optical device 300. The heavy metal injection device 200 is connected to the magnetic confinement device 100. The magnetic confinement device 100 is configured to generate a plasma. The heavy metal injection device 200 is configured to inject, if the plasma meets a preset injection condition, a designated heavy metal into the magnetic confinement device 100, so that the designated heavy metal interacts with the plasma in the magnetic confinement device 100 to generate an extreme ultraviolet light. The optical device 300 is configured to collect the extreme ultraviolet light.

With the solution of the embodiment of the present disclosure, the magnetic confinement device that meets the requirement of generating an extreme ultraviolet light has a low cost, a simple and stable operation, and a high electro-optic conversion efficiency, improving the stability of the extreme ultraviolet light and also reducing the cost of generating the extreme ultraviolet light.

In an embodiment, the magnetic confinement device 100 comprises a tokamak, which includes a vacuum chamber, a magnet, and a radio frequency wave antenna. The vacuum chamber is configured to accommodate the plasma. The magnet is configured to generate a magnetic field to constrain the plasma in the vacuum chamber through the magnetic field. The radio frequency wave antenna is configured to transmit a microwave or a millimeter wave into the vacuum chamber to couple the plasma with the microwave or the millimeter wave and drive a plasma current.

It is to be noted that the vacuum chamber is a core part of the tokamak, which is generally formed of stainless steel and has high vacuum degree and high temperature resistance, to ensure the stable operation of the tokamak. A major radius of the vacuum chamber generally ranges from 1.2 m to 1.3 m, and a minor radius of the vacuum chamber generally ranges from 0.2 m to 0.3 m.

The magnet is configured to generate a high magnetic field to control the motion of the plasma generated by the tokamak through the magnetic field, and also to control the shape of the plasma generated by the tokamak through the magnetic field. The magnet is made of superconducting coils, which can achieve zero resistance at a low temperature, thereby improving the stability and efficiency of the magnetic field. The strength of a circumferential magnetic field is generally between 1 T and 2 T.

The radio frequency wave antenna generally use a phased waveguide array, and a reflection coefficient of the antenna may be reduced by adjusting a phase difference between main waveguides, thereby improving the efficiency of driving the plasma current. The microwave or the millimeter wave may heat the plasma and drive the plasma current. The principle of interaction between the plasma and the microwave or the millimeter wave includes low hybrid resonance or electron cyclotron resonance.

With the solution of the embodiment of the present disclosure, the vacuum chamber accommodates the plasma; the magnet generates a magnetic field to control the motion of the plasma in the vacuum chamber through the magnetic field; the radio frequency wave antenna transmits a microwave or millimeter wave into the vacuum chamber to couple the plasma with the microwave or millimeter wave and drive a plasma current. As the plasma generated by the tokamak can be confined in the vacuum chamber through the magnetic field, effectively reducing the corrosion and burning damage to a wall material of an emitting light source by the plasma, thus prolonging the lifetime of the extreme ultraviolet light source assembly and a light source.

In an embodiment, the extreme ultraviolet light source assembly further includes a detecting device. The detecting device is configured to detect the plasma to obtain a plasma parameter; determine whether the plasma meets the preset injection condition based on plasma parameter; send an injection instruction to the heavy metal injection device 200 if the plasma meets the preset injection condition to control heavy metal injection device 200 to inject the designated heavy metal into the magnetic confinement device 100.

It is to be noted that during the process of generating an extreme ultraviolet light, the detecting device may be controlled to detect a density, a temperature, an impurity, and a magnetic field and other parameters of the plasma in real-time. The detecting device may be called a diagnostic device of the density, temperature, impurities, and magnetic field of the plasma. The detecting device includes, but is not limited to, a microwave interferometer, a Langmuir probe, a magnetic probe, and various radiation diagnostics (a hard X-ray, a soft X-ray, an AXUV detector).

In an embodiment, the extreme ultraviolet light source assembly further includes a control device. The control device is configured to adjust the plasma parameter if the plasma does not meet the preset injection condition.

It is to be noted that during the process of generating an extreme ultraviolet light, the control device may adjust the plasma parameter, achieving real-time adjustment and control of the extreme ultraviolet light source assembly, maintaining a stable plasma state and optimizing an output of the light source.

In an embodiment, the extreme ultraviolet light source assembly further includes a data collection device. The data collection device is configured to collect and record a plasma parameter and an extreme ultraviolet light parameter.

It is to be noted that during the process of generating an extreme ultraviolet light, the data collection device may be controlled to detect and record the discharge process of the extreme ultraviolet light source assembly, such as recording the plasma parameter and the extreme ultraviolet light parameter. In a case that the discharge process is completed, various components in the extreme ultraviolet light source assembly may be controlled to be gradually turned off, and necessary maintenance and repair may be implemented on the extreme ultraviolet light source assembly to ensure the long-term stable operation of the extreme ultraviolet light source assembly.

Figure 3:
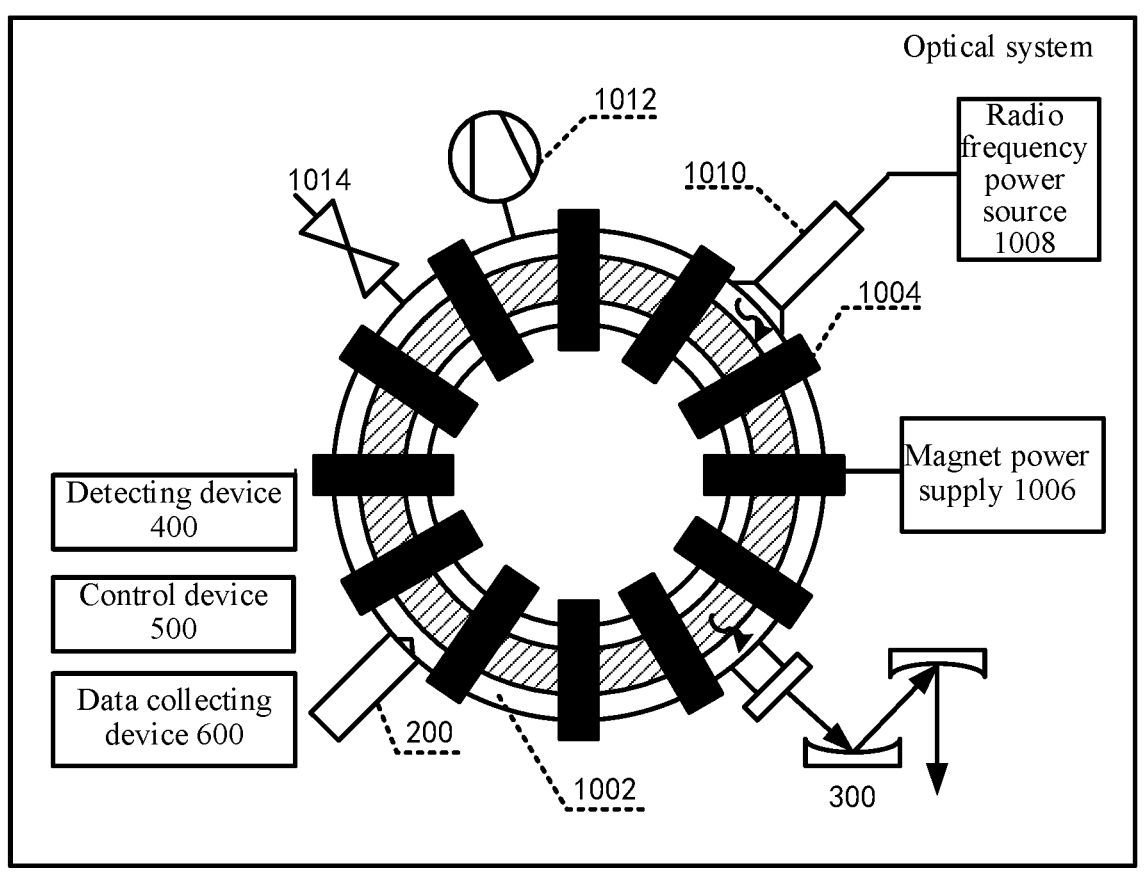
FIG. 3 is a diagram of an architecture of an optical system according to an embodiment of the present disclosure.

Reference is made to FIG. 3, which is a diagram of an architecture of an optical system according to an embodiment of the present disclosure. The optical system includes an extreme ultraviolet light source assembly. As shown in FIG. 3, the magnetic confinement device in the extreme ultraviolet light source assembly is a tokamak. The extreme ultraviolet light source assembly further includes a heavy metal injection device 200, an optical device 300, a detecting device 400, a control device 500, and a data collection device 600. The tokamak includes a vacuum chamber 1002, a magnet 1004, a magnet power supply 1006, a radio frequency power source 1008, a radio frequency wave antenna 1010, a pumping set 1012, and an intake valve assembly 1014. The vacuum chamber 1002 is configured to accommodate a plasma. The magnet 1004 is configured to generate a magnetic field to constrain the plasma in vacuum chamber 1002 through the magnetic field. The magnet power supply 1006 is configured to provide a current to the magnet 1004. The radio frequency power source 1008 is configured to generate a high-power microwave or a high-power millimeter wave. The radio frequency wave antenna 1010 is configured to transmit the microwave or the millimeter wave to the vacuum chamber 1002, to couple the plasma with the microwave or the millimeter wave and drive a plasma current. The pumping set 1012 is configured to discharge gases from the vacuum chamber 1002 to maintain a high vacuum environment. The intake valve assembly 1014 is configured to control a rate and a type of a gas entering the vacuum chamber 1002. The detecting device 400 is configured to detect the plasma to obtain a plasma parameter; determine whether the plasma meets a preset injection condition based on the plasma parameter; send, if the plasma meets the preset injection condition, an injection instruction to the heavy metal injection device 200, to control the heavy metal injection device 200 to inject the designated heavy metal into the tokamak. The control device 500 is configured to adjust the plasma parameter if the plasma does not meet the preset injection condition. The data collection device 600 is configured to collect and record a plasma parameter and an extreme ultraviolet light parameter. The heavy metal injection device 200 is configured to inject the designated heavy metal into the tokamak if the plasma meets preset injection condition, so that the designated heavy metal interacts with the plasma in the tokamak to generate an extreme ultraviolet light. The optical device 300 is configured to collect, filter, and focus the extreme ultraviolet light, and is further configured to measure and control the extreme ultraviolet light.

It is to be noted that the radio frequency power source 1008 may use a magnetron, with a microwave frequency of generally 2.45 GHz and a power ranging from hundreds of kilowatts to megawatts. The pumping set 1012 generally includes a molecular pump, a mechanical pump, and an ion pump to provide sufficient pumping rate. The composition and density of the plasma may be adjusted by adjusting the intake valve assembly 1014. The working gas is generally hydrogen gas.

With the solution of the embodiment of the present disclosure, the tokamak for generating an extreme ultraviolet light has a low cost, reusability, and stable operation, the extreme ultraviolet light source assembly can generate a stable plasma and a stable extreme ultraviolet light, and can also reduce the manufacturing cost of the light source. In addition, the plasma generated by the extreme ultraviolet light source assembly can be confined in the vacuum chamber through the magnetic field, effectively reducing the corrosion and burning damage to wall material of the emitting light source by the plasma, thus prolonging the lifetime of the extreme ultraviolet light source assembly and the light source. The control device adjusts the plasma parameter fed back from the detecting device in real-time, accurately controlling the density, the temperature, the shape and other parameters of the plasma, thereby generating more stable the extreme ultraviolet light.

In an embodiment of the present disclosure, the optical system may further include an assembly control unit, which may be any type of a stationary or mobile computing device, including a mobile computer or mobile computing device (such as a tablet, a personal digital assistant, a laptop, and a netbook) or other types of mobile devices, or a static computing device such as a desktop computer or a personal computer (PC). The assembly control unit may also be a mobile or stationary server.

The assembly control unit is configured to execute computer executable instructions, and the computer executable instructions, when executed by the assembly control unit, perform steps of the above method for generating an extreme ultraviolet light.

The above is a schematic solution of an assembly control unit in this embodiment. It is to be noted that the technical solution of the assembly control unit belongs to the same concept as the technical solution of the method for generating an extreme ultraviolet light as described above. For any details not detailed in the technical solution of the assembly control unit, reference may be made to the description of the technical solution of the method for generating an extreme ultraviolet light described above.

A computer-readable storage medium is further provided according to an embodiment of the present disclosure, which stores computer-executable instructions. The computer-executable instructions, when executed by a processor, perform steps of the method for generating an extreme ultraviolet light as described above.

The above is a schematic solution of a computer-readable storage medium in this embodiment. It is to be noted that the technical solution of the storage medium belongs to the same concept as the technical solution of the method for generating an extreme ultraviolet light. For any details not detailed in the technical solution of the storage medium, reference may be made to the description of the technical solution of the method for generating an extreme ultraviolet light described above.

A computer program is further provided according to an embodiment of the present disclosure, which, when executed in a computer, causes the computer to perform steps of the method for generating an extreme ultraviolet light as described above.

The above is a schematic solution of a computer program in this embodiment. It should be noted that the technical solution of the computer program belongs to the same concept as the technical solution of the method for generating an extreme ultraviolet light as described above. For any details not detailed in the technical solution of the computer program, reference may be made to the description of the technical solution of the method for generating an extreme ultraviolet light described above.

The above describes specific embodiments of the present disclosure. Other embodiments are also within the scope of the claims. In some cases, the operations or steps recorded in the claims may be executed in a different order than in the embodiments and still achieve the desired result. In addition, the process depicted in the drawings does not necessarily require a specific or continuous order to achieve the desired result. In some embodiments, multitasking and parallel processing are also possible or may be advantageous.

The computer executable instructions include computer program codes, which may be in the form of source codes, object codes, executable files, or some intermediate forms. The computer-readable medium may include: any entity or device capable of carrying the computer program codes, a recording medium, a USB disk, a portable hard disk, a magnetic disc, an optical disc, a computer memory, a read-only memory (ROM), a random access memory (RAM), an electrical carrier signal, a telecommunications signal, and a software distribution medium, and the like. It is to be noted that the content contained in the computer-readable medium may be appropriately added or cut according to the requirements of patent practice. For example, in certain regions, according to the patent practice, the computer-readable medium does not include electric carrier signals and telecommunications signals.

It is to be noted that for the convenience of description, the aforementioned embodiments of the method are all expressed as a series of action combinations. However, those skilled in the art should be aware that the embodiments of the present disclosure are not limited by the order of the described actions, as according to the embodiments of the present disclosure, certain steps may be performed in other sequences or simultaneously. Secondly, those skilled in the art should also be aware that the embodiments described in the present disclosure are all preferred embodiments, and the actions and modules involved may not necessarily be necessary for the embodiments in the present disclosure.

In the above embodiments, the description of each embodiment has its own emphasis. For parts that are not detailed in one embodiment, reference may be made to the relevant description of another embodiment.

The preferred embodiments disclosed above are only intended to assist in explaining the present disclosure. Not all the details of the embodiments are described, and the present disclosure is not limited to the specific embodiments described above. Apparently, according to the embodiments of the present disclosure, many modifications and changes may be made. These embodiments are selected and specifically described in the present disclosure to better explain the principles and practical applications of the embodiments, so that those skilled in the art can better understand and utilize the present disclosure. The present disclosure is only limited by the claims and all their scope and equivalents.

The invention claimed is:

1. A method for generating an extreme ultraviolet light, the method comprising:

generating a plasma by a magnetic confinement device;

controlling, if the plasma meets a preset injection condition, a heavy metal injection device to inject a designated heavy metal into the magnetic confinement device, wherein the designated heavy metal interacts with the plasma in the magnetic confinement device to generate an extreme ultraviolet light; and controlling an optical device to collect the extreme ultraviolet light.

2. The method according to claim 1, wherein the designated heavy metal comprises at least one of a tin powder, a tungsten powder, a nickel powder, and a tantalum powder.

3. The method according to claim 1, wherein the magnetic confinement device comprises one of a tokamak, a stellarator, a magnetic mirror, a field reversed configuration, or a reversed field pinch.

4. The method according to claim 1, wherein controlling the heavy metal injection device to inject the designated heavy metal into the magnetic confinement device comprises:

controlling the heavy metal injection device to continuously inject the designated heavy metal of a target mass into the magnetic confinement device.

5. The method according to claim 4, wherein before the controlling the heavy metal injection device to continuously inject the designated heavy metal of a target mass into the magnetic confinement device, the method further comprises:

determining the target mass of the designated heavy metal based on an optical power of the extreme ultraviolet light and an ionization rate of the designated heavy metal.

6. The method according to claim 1, wherein before controlling the heavy metal injection device to inject the designated heavy metal into the magnetic confinement device, the method further comprises:

detecting the plasma to obtain a plasma parameter; and determining whether the plasma meets the preset injection condition based on the plasma parameter.

7. The method according to claim 6, wherein after the determining whether the plasma meets the preset injection condition based on the plasma parameter, the method further comprises:

adjusting the plasma parameter if the plasma does not meet the preset injection condition.

8. The method according to claim 1, wherein after the controlling an optical device to collect the extreme ultraviolet light, the method further comprises:

collecting and recording a plasma parameter and an extreme ultraviolet light parameter.

9. The method according to claim 1, wherein after the controlling an optical device to collect the extreme ultraviolet light, the method further comprises:

controlling the optical device to filter and focus the extreme ultraviolet light.

10. An extreme ultraviolet light source assembly, comprising:

a magnetic confinement device, configured to generate a plasma;

a heavy metal injection device, connected to the magnetic confinement device and configured to inject, if the plasma meets a preset injection condition, a designated heavy metal into the magnetic confinement device, wherein the designated heavy metal interacts with the plasma in the magnetic confinement device to generate an extreme ultraviolet light; and an optical device, configured to collect the extreme ultraviolet light.

11. The extreme ultraviolet light source assembly according to claim 10, wherein the magnetic confinement device comprises a tokamak, and the tokamak comprises:

a vacuum chamber, configured to accommodate the plasma;

a magnet, configured to generate a magnetic field to constrain the plasma in the vacuum chamber through the magnetic field; and a radio frequency wave antenna, configured to transmit a microwave or a millimeter wave into the vacuum chamber to couple the plasma with the microwave or the millimeter wave and drive a plasma current.

12. The extreme ultraviolet light source assembly according to claim 10, further comprising:

a detecting device, configured to:

detect the plasma to obtain a plasma parameter;

determine whether the plasma meets the preset injection condition based on the plasma parameter; and send, if the plasma meets the preset injection condition, an injection instruction to the heavy metal injection device to control the heavy metal injection device to inject the designated heavy metal into the magnetic confinement device.

13. The extreme ultraviolet light source assembly according to claim 10, further comprising:

a control device, configured to adjust the plasma parameter if the plasma does not meet the preset injection condition.

14. The extreme ultraviolet light source assembly according to claim 10, further comprising:

a data collecting device, configured to collect and record a plasma parameter and an extreme ultraviolet light parameter.

15. An optical system, comprising the extreme ultraviolet light source assembly according to claim 10.

\* \* \* \* \*